United States Patent
Sullivan et al.

(10) Patent No.: US 7,365,527 B2
(45) Date of Patent: Apr. 29, 2008

(54) SYSTEM AND METHOD FOR EXTENDING THE RANGE OF A FREQUENCY MEASURING DEVICE

(75) Inventors: Mark Sullivan, Annandale, VA (US); Darryl S. Bierly, Aldie, VA (US)

(73) Assignee: Argon Engineering, Fairfax, VA (US)

( * ) Notice: Subject to any disclaimer, the term of this patent is extended or adjusted under 35 U.S.C. 154(b) by 1247 days.

(21) Appl. No.: 10/419,880

(22) Filed: Apr. 22, 2003

(65) Prior Publication Data

US 2004/0008020 A1    Jan. 15, 2004

Related U.S. Application Data

(60) Provisional application No. 60/374,144, filed on Apr. 22, 2002.

(51) Int. Cl.
  G01R 23/00    (2006.01)
  G01R 23/16    (2006.01)
  G01R 13/14    (2006.01)
  G01R 23/165    (2006.01)

(52) U.S. Cl. .............. 324/76.19; 324/76.21; 324/76.24; 324/76.31

(58) Field of Classification Search ............ 324/76.19, 324/76.21, 76.24, 76.31
See application file for complete search history.

(56) References Cited

U.S. PATENT DOCUMENTS

| | | | |
|---|---|---|---|
| 4,695,790 A | | 9/1987 | Mathis |
| 4,951,219 A | * | 8/1990 | Zimmer .................. 324/76.35 |
| 5,099,194 A | * | 3/1992 | Sanderson et al. ....... 324/76.47 |
| 5,099,243 A | * | 3/1992 | Tsui et al. ............... 324/76.47 |
| 5,293,114 A | * | 3/1994 | McCormick et al. .... 324/76.21 |
| 5,323,103 A | * | 6/1994 | Choate et al. ........... 324/76.21 |
| 6,031,879 A | * | 2/2000 | Pace et al. ............... 324/76.21 |

FOREIGN PATENT DOCUMENTS

WO    PCT/US03/12387    4/2003

* cited by examiner

Primary Examiner—Andrew H. Hirshfeld
Assistant Examiner—Timothy J Dole
(74) Attorney, Agent, or Firm—Pillsbury Winthrop Shaw Pittman, LLP

(57) ABSTRACT

A range of a frequency measuring device having limited range is extended by pre-processing an input signal. The input signal is divided into a plurality of channels. In each channel, the input signal is divided into sub-bands. A frequency of the input signal is determined using a frequency measuring device having limited range. The frequencies are stored in a frequency set. The frequency set is used to determine a frequency associated with the input signal according a set of pre-determined reconstruction rules.

4 Claims, 11 Drawing Sheets

SYSTEM AND METHOD FOR EXTENDING THE RANGE OF A FREQUENCY MEASURING DEVICE

This application claims the benefit of U.S. Provisional Application No. 60/374,144, filed Apr. 22, 2002, which is herein incorporated by reference in its entirety.

BACKGROUND

1. Field of the Invention

The present invention relates generally to signal processing. More specifically, the present invention relates to increasing the frequency range of a frequency measuring device.

2. Background of the Invention

Frequency measuring devices include such devices as frequency counters, frequency discriminators, instantaneous frequency measurement (IFM) receivers and digital spectrum analyzers. These devices have a variety of uses permeating throughout the commercial and government sectors. These uses include modulation and demodulation of signals, signals analysis in spectrum analyzers and processing signals in communication systems.

Frequency measurement devices however typically have limited range. For example, analysis of a signal having a 2 GHz bandwidth requires a frequency measuring device having at least a 2 GHz bandwidth. If an available frequency measuring device only has a 500 MHz bandwidth, the signal may not be able to be effectively analyzed. Consequently, new equipment must be obtained to analyze such signals. Unfortunately, procurement of new equipment is generally an expensive proposition, and therefore is generally avoided where possible.

SUMMARY OF THE INVENTION

The present invention avoids the need to incur substantial expense associated with the purchase or leasing of new equipment by extending the effective range of conventional frequency measuring devices. The present invention extends the range of a frequency measuring device, preferably, by pre-processing a signal so that it can be analyzed with the frequency measuring device having a limited range despite the frequency measuring device's limited range.

In one embodiment, a band of interest is partitioned into a set of sub-bands. Each of the sub-bands is translated to a common frequency and added together. The sub-bands are chosen to have a bandwidth that can be analyzed by the frequency measuring device. Though each of the sub-bands can have a different range, each of the ranges is chosen to be within the range of the frequency measuring device. Thus, the composite signal is within the range of the frequency measuring device. The frequency measuring device then measures the frequency of the signal.

To resolve the ambiguity that would otherwise be present when all of the sub-bands are shifted to the common band for analysis, the process of dividing the signal into sub-bands is performed multiple times using different sets of sub-bands. The sub-bands are analyzed to generate a set of frequencies for analysis. From the set of frequencies measured by the frequency measuring device, the original signal frequency can be reconstructed. Multiple frequency measuring devices can be used to provide parallel frequency measurement of the sub-bands to increase the throughput of the present invention.

In one embodiment, the present invention is a system for extending the range of a frequency measuring device having a limited range. The system includes a plurality of channels to process an input signal. Each channel includes a pre-processing element to divide the input signal into a plurality of sub-bands, each channel having a different set of sub-bands. Each channel further includes a combining element to combine the plurality of sub-bands into a composite signal having a bandwidth within the limited range of the frequency measuring device, wherein the frequency measuring device measures a frequency for each composite signal to form a frequency set. The system further includes a reconstruction element to receive the frequency set and use the frequency set to determine a frequency associated with the original signal.

In another embodiment, the present invention is a method for extending a range of a frequency measuring device having a limited range. The method begins with the step of creating a one-to-one mapping of a set of frequencies to a frequency of an input signal in an input signal range. During operation, an input signal is received. The received input signal is applied to a plurality of processing channels. The input signal is divided into a plurality of sub-bands in each channel. The sub-bands are combined to form a composite signal that has a bandwidth within the limited range of the frequency measuring device. A frequency is measured for each of the composite signals to form a frequency set. Using the frequency set, a frequency associated with the input signal is determined.

DETAILED DESCRIPTION OF THE INVENTION

Figure 1:
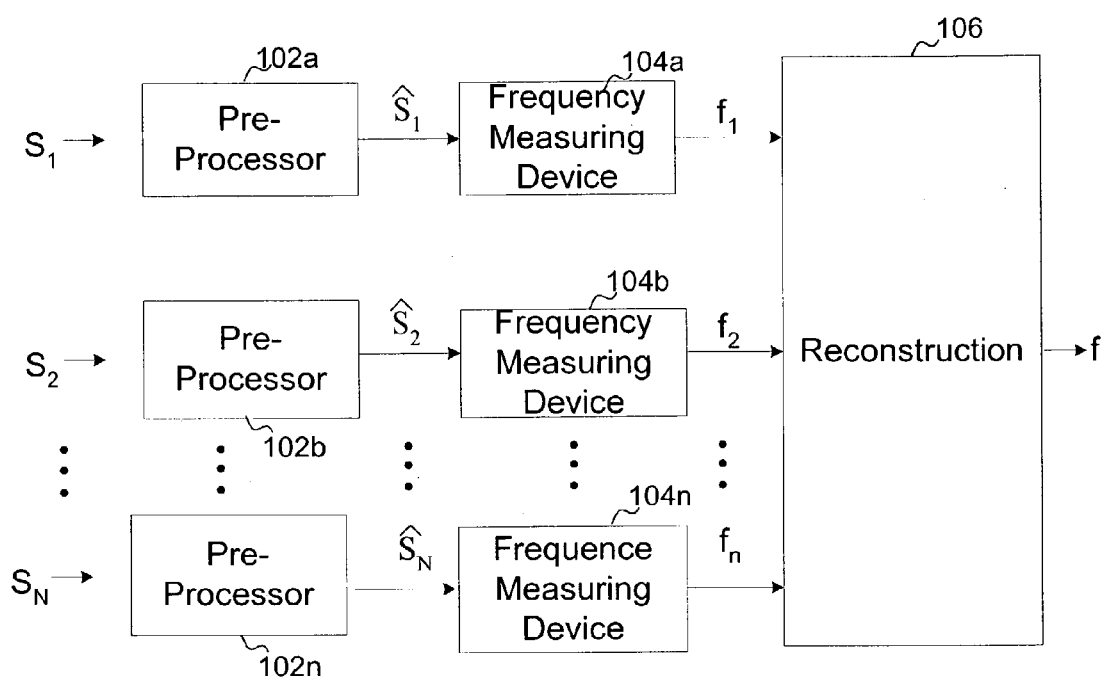
FIG. 1 is a schematic diagram of a system for extending a frequency range of a frequency measuring device according to an embodiment of the present invention.

There are two ways to produce the composite signal. The first is to translate each of the sub-bands to the common band. A second way to create the composite band is to invert the sub-bands so that information in the upper part of the sub-band appears in the lower portion of the translated band, and information in the lower part of the sub-band appear in the upper portion of the translated band. The translation or inversion can be provided in several ways. For example, well-known RF translation (e.g., mixing and filtering) techniques can be used. Depending on the translation, (high-side or low-side) inversion of the sub-band will or will not take place. Alternatively, well-known sampling techniques can be used. Using the sampling techniques, for example, alternative sub-bands are inverted by the sampling process itself.

The present invention can be described mathematically as an aid to its understanding. A frequency measuring device can analyze frequencies of an input signal in the limited range $f \in [L, U]$. The input signal S has an associated frequency spectrum S(f). The present invention pre-processes the input signal in such a way that the resulting pre-processed signal spectrum $\hat{S}(f)$, wherein $f \in [L, U]$, contains the same information as S(f) over some input range $f \in [L_{IN}, U_{IN}]$. In this case, signal spectrum $\hat{S}(f)$, wherein $f \in [L, U]$, is a signal spectrum that can be analyzed by the frequency measuring device. $f \in [L_{IN}, U_{IN}]$ is the spectrum of the input signal or some portion thereof.

Where the spectral bandwidth of the input is less than or equal to the bandwidth of the frequency measuring device, i.e., $U_{IN} - L_{IN} \leq U - L$, this can be accomplished using simple frequency translation so that the resulting spectrum is within the bandwidth that can be analyzed by the frequency measuring device. One such frequency translation is $\hat{S}(f) = S(f - L_{IN} + L)$, $f \in [L, U]$. The frequency of the signal of interest is measured over the range of the frequency measuring device, $f \in [L, U]$. Then, the amount of the translation is added back to the result to reconstruct the original input frequency. Techniques for performing the required frequency translations are well-known. For example, frequency translation can be implemented as a downconverter with RF technology using oscillators, mixers, and filters, or as a bandpass sampler with digital technology using a sample-and-hold circuit or a digitizer.

If the bandwidth of the input signal is greater than the bandwidth of the frequency measuring device, i.e., $U_{IN} - L_{IN} > U - L$, the present invention pre-processes the input signal in such a way to allow the frequency measuring device to be able to measure the frequency content of the input signal. In one embodiment of the present invention, this is accomplished by sub-banding. Sub-banding divides the input signal into channels, wherein each channel has a bandwidth less than or equal to the bandwidth of the frequency measuring device, i.e., the bandwidth of each channel is less than U-L. One problem with sub-banding alone is that a frequency measuring device is required for each and every sub-band. To avoid this requirement, the sub-bands can be combined (e.g., added together) and translated to a range that a single frequency measuring device can analyze. However, the original signal frequency cannot be unambiguously determined without knowing which sub-band contained the signal.

The present invention solves this ambiguity by pre-processing the input signal using two or more sets of sub-bands to unambiguously recover the signal frequency without requiring a frequency measurement device for each and every sub-band. The most general form of the pre-processing of the present invention can be written as:

$$\hat{S}_i(f) = \sum_{j=1}^{M_i} S_i(\Delta_{ij} \pm f) \; i = 1, \ldots, N, f \in [L_i, U_i]. \quad (1)$$

In equation (1), $\hat{S}(f)$ is the composite of the sub-bands, $\hat{S}_i(f)$, translated to a band that can be analyzed by the frequency measuring device. $S_i(f)$ is the input spectrum, i.e., the signal having a wideband spectrum to be analyzed associated with a channel i. $S_i(f)$ is divided into sub-bands, whose boundaries are defined by the $\Delta_{ij}$'s.

In many applications, $S_i(f) = S(f)$ for $i = 1, \ldots, N$. However, for some specialized applications to be discussed later this may not necessarily be the case.

Thus, in general each set of sub-bands associated with the index i can be obtained from a different input signal with spectrum $S_i(f)$.

If a term of the summation is of the form $S_i(\Delta_{ij} + f)$, then the corresponding sub-band of the spectrum is translated in frequency by an amount $\Delta_{ij}$, which may be a positive or negative offset. Subscript i of $\Delta_{ij}$ corresponds to the processing channel. Subscript j of $\Delta_{ij}$ corresponds to the particular sub-band. If a term of the summation is of the form $S_i(\Delta_{ij} - f)$, then the corresponding sub-band of the spectrum is inverted and translated in frequency by an amount $\Delta_{ij}$, which may be a positive or negative offset.

The number of channels N, the set of frequency offsets $\{\Delta_{ij}\}$, and the choice of inverted or non-inverted spectral sub-bands are selected to unambiguously recover the original frequency of a signal present in each of the N channels over a frequency range [L, U]. One criterion for choosing the sub-bands is that there be a one-to-one mapping of the frequencies in the signal to be analyzed to the frequencies in the composite signal. That is, the original frequency must be a reversible function of the pre-processing of the present invention such that if processing of the present invention maps a frequency f as a function of the set of frequencies $\{f_1, f_2, \ldots f_N\}$, then given the set of frequencies $\{f_1, f_2, \ldots f_N\}$, the original input frequency f can unambiguously determined. That is, the mapping is reversible. This is required to resolve an ambiguity that would otherwise be present in the composite signal.

In addition, the mapping preferably preserves relative relationships between frequencies in the original signal. Thus, if two frequencies are far apart in the input signal, it is preferred to have those frequencies map to frequencies that are far apart in the composite signal. Likewise, if two frequencies are close together in the input signal, it is preferred to have those frequencies map to frequencies that are close together.

The reason for this is that the measuring devices are not perfect. There are generally small errors in their measurements. Consequently, the frequency obtained using their measurements applied in the mapping process may not yield the exact input frequency. It is desirable that the mapping not amplify the error by mapping to a frequency that is not close to the true frequency. If the mapping were not chosen with this in mind, then a small frequency error could result in a large difference between the input frequency and the frequency reported by the reconstruction algorithm of the present invention.

FIG. 1 is a schematic diagram of a system for increasing the range of a frequency measuring device by pre-processing an input signal according to an embodiment of the present invention. N input signals $S_1(f), S_2(f), \ldots S_N(f)$ are input to N processors 102a, 102b, ... 102n, wherein N is any positive integer. As described above, in the general case, each $S_i(f)$ can be different. However, the most common application is for a single input signal, S(f), to be applied to the N pre-processors 102a, 102b, ... 102n. Pre-processors 102a, 102b, ... 102n divide the signal applied to it into sub-bands in a different manner to produce outputs $S_1(f)$, $S_2(f), \ldots S_N(f)$.

Pre-processors 102a, 102b, ... 102n divide up the channels into sub-bands, and add (or otherwise combine the sub-bands) into composite signals $\hat{S}_1(f), \hat{S}_2(f) \ldots \hat{S}_3(f)$. Composite signals $\hat{S}_1(f), \hat{S}_2(f) \ldots \hat{S}_3(f)$ are analyzed by frequency measuring devices 104a, 104b, ... 104n. Frequency measuring devices 104a, 104b, ... 104n produce a set of N measured frequencies. The N measured frequencies are input to a reconstruction algorithm 106. Reconstruction algorithm 106 reproduces the original frequency, f, of the input signal from the set of N measured frequencies output by frequency measuring devices 104a, 104b ... 104n.

Figure 2:
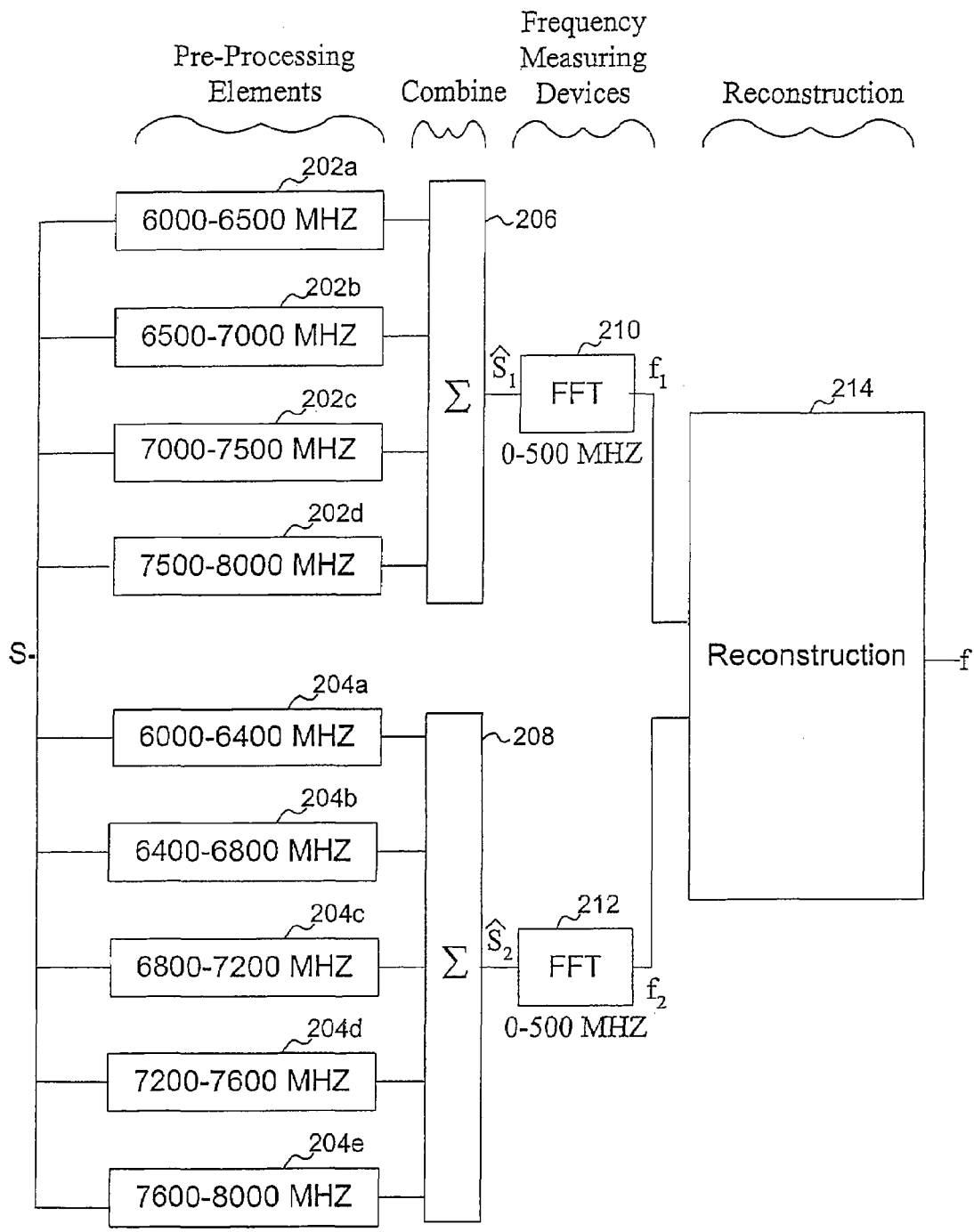
FIG. 2 is another embodiment of the system for extending a frequency range of a frequency measuring device according to an embodiment of the present invention.

FIG. 2 is a schematic diagram of an exemplary application of the present invention to extend the frequency range of a frequency measuring device. In the example shown in FIG. 2, the frequency measuring device, as will be described, has a bandwidth of 500 MHz. An input signal S is applied to two banks of pre-processing elements. The two banks of pre-processing elements correspond to two processing channels, that is N=2 in Equation (1). The region of interest is a 2 GHz band extending from 6 GHz to 8 GHz. In this it is assumed that none of the sub-bands are inverted.

The first channel includes a first bank of pre-processing elements 202a, 202b, 202c and 202d that divides the input signal into four 500 MHz-wide sub-bands. Pre-processing element 202a passes the input signal for a 500 MHz band from 6000-6500 MHz; pre-processing element 202b passes the input signal for a 500 MHz band from 6500-7000 MHz; pre-processing element 202c passes the input signal for a 500 MHz band from 7000-7500 MHz; and pre-processing element 202d passes the input signal for a 500 MHz band from 7500-8000 MHz. Each pre-processing element then translates or otherwise shifts the signal to a range that can be processed by frequency measuring device 210.

The output of each pre-processing element is input to a combining element 206. Combining element 206 can be any device that can combine the sub-bands into a composite signal that can be analyzed by the frequency measuring device. For example, combining element 206 is preferably a summer. Thus, combining element 206 sums the outputs of the pre-processors to form a composite signal $\hat{S}_1(f)$. Composite signal $\hat{S}_1(f)$ is input to a frequency measuring device 210. In the present example frequency measuring device 210 is an FFT processor. Frequency measuring device 210 determines the frequency content of composite signal $\hat{S}_1(f)$.

The second channel includes a second bank of pre-processing elements 204a, 204b, 204c, 204d and 204e that divides input signal S into five 400 MHz-wide sub-bands. Pre-processing element 204a passes the input signal for a 400 MHz band from 6000-6400 MHz; pre-processing element 204b passes the input signal for a 400 MHz band from 6400-6800 MHz; pre-processing element 204c passes the input signal for a 400 MHz band from 6800-7200 MHz; pre-processing element 204d passes the input signal for a 400 MHz band from 7200-7600 MHz; and pre-processing element 204e passes the input signal for a 400 MHz band from 7600-8000 MHz. Each pre-processing element then translates or otherwise shifts the signal to a range that can be processed by frequency measuring device 212.

The output of each pre-processing is input to a combining element 208. Combining element 208 can be any device that can combine the sub-bands into a signal that can be analyzed by the frequency measuring device. For example, preferably, combining element 208 is a summer. Thus, combining element 208 sums the outputs of the pre-processors to form a composite signal $\hat{S}_2(f)$. Composite signal $\hat{S}_2(f)$ is input to a frequency measuring device 212. In the present example frequency measuring device 212 is an FFT processor. Frequency measuring device 210 determines the frequency content of composite signal $\hat{S}_2(f)$.

For simplicity of explanation of the present invention, it will be assumed that the input signal is a monochromatic signal, i.e., the input signal has only one frequency component. Such a signal might be a radar signal or some other single frequency signal. It will be appreciated by those having skill in the art that the present invention can be used with more complex signals, such as modulated signals, by extension of the techniques described below to each frequency component in the input signal.

For purposes of the present example, assume that there is a monochromatic input signal S having a single frequency f. Assume that in a 500 MHz sub-band (channel 1), input signal S is represented by a frequency $f_1$. In addition, assume that in a 400 MHz sub-band (channel 2), input signal S is represented by a frequency $f_2$. The frequency set $\{f_1, f_2\}$ can be used by a reconstruction process 214 to determine the actual frequency of input signal S.

Figure 3:
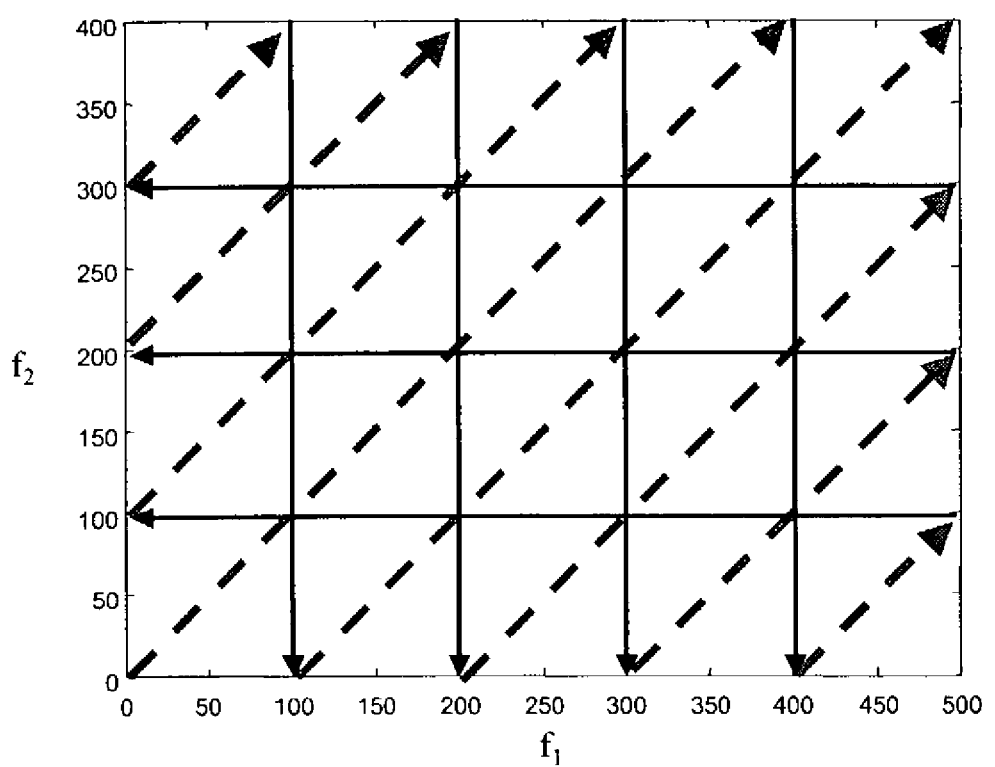
FIG. 3 is a graphical representation of a one-to-one mapping of a set of frequencies to a frequency of an input signal according to an embodiment of the present invention.

FIG. 3 shows a mapping of the values of the set of frequencies $\{f_1, f_2\}$ as the input frequency is swept from 6 GHz to 8 GHz. This mapping is a one-to-one mapping of the input frequency f to the set of frequencies $\{f_1, f_2\}$. FIG. 3 is created by sweeping the input frequency from 6 GHz to 8 GHz (the origin corresponding to 6 GHz), and determining what the set of frequencies $\{f_1, f_2\}$ should be for each particular frequency in that range.

As the input frequency increases, each of the output frequencies increases as shown by the dashed arrows. As the input frequency reaches a sub-band boundary (a multiple of 400 MHz or 500 MHz) the pair of output frequencies shifts abruptly as shown by the solid arrows. Because the dashed arrows do not intersect, there is a unique set of frequencies $\{f_1, f_2\}$ for each input frequency f. Thus, the input frequency can be unambiguously recovered from the set of frequencies $\{f_1, f_2\}$ output by frequency measuring devices 210 and 212.

The associated parameters for the general form of the pre-processing given by Equation 1 for this example are N=2, $M_1$=4, $\Delta_{1j}$=−6000−(j−1)*500 MHz, [$L_1, U_1$]=[0,500 MHz], $M_2$=5, $\Delta_{2j}$=−6000−(j−1)*400 MHz, and [$L_2, U_2$]=[0, 400 MHz]. As described above, the $\Delta_{ij}$ correspond to the sub-bands. The equations for $\Delta_{ij}$ translate the sub-band sufficient such that the lower boundary of the sub-band is at 0.

Using all non-inverted spectral segments, if the same signal is observed at $f_1$ in $\hat{S}_1(f)$ and at $f_2$ in $\hat{S}_2(f)$, then the original frequency of the corresponding signal in $\hat{S}_1(f)$ and $\hat{S}_2(f)$ is unambiguously given by f according to the reconstruction rule shown in Table 1 over an input range [6, 8 GHz].

TABLE 1

Input frequency reconstruction rule

| f | $f_1-f_2$ | f-6000 |
|---|---|---|
| 6000–6400 MHz | 0 | $(f_1 + f_2)/2$ |
| 6400–6500 MHz | 400 MHz | $(f_1 + f_2 + 400)/2$ |
| 6500–6800 MHz | −100 MHz | $(f_1 + f_2 + 900)/2$ |
| 6800–7000 MHz | 300 MHz | $(f_1 + f_2 + 1300)/2$ |
| 7000–7200 MHz | −200 MHz | $(f_1 + f_2 + 1800)/2$ |
| 7200–7500 MHz | 200 MHz | $(f_1 + f_2 + 2200)/2$ |
| 7500–7600 MHz | −300 MHz | $(f_1 + f_2 + 2700)/2$ |
| 7600–8000 MHz | 100 MHz | $(f_1 + f_2 + 3100)/2$ |

The reconstruction rule is based on calculating the difference between $f_1$ and $f_2$ as shown in the second column of the table. A table lookup can be performed to determine the difference value in column 2 closest to the calculated difference. The corresponding operation in column 3 is the reconstruction rule. For example, suppose $f_1$ is determined to be 100 MHz and $f_2$ is determined to be 400 MHz. Then, the difference $f_1-f_2$ is −300 MHz. Looking in the table 1, this corresponds to the reconstruction operation, $(f_1+f_2+2700)/2$. Thus, the reconstructed frequency is $(100+300+2700)/2$, which is 1550 MHz. Adding the translated 6000 MHz, the reconstructed original frequency is 7550 MHz.

Figure 4:
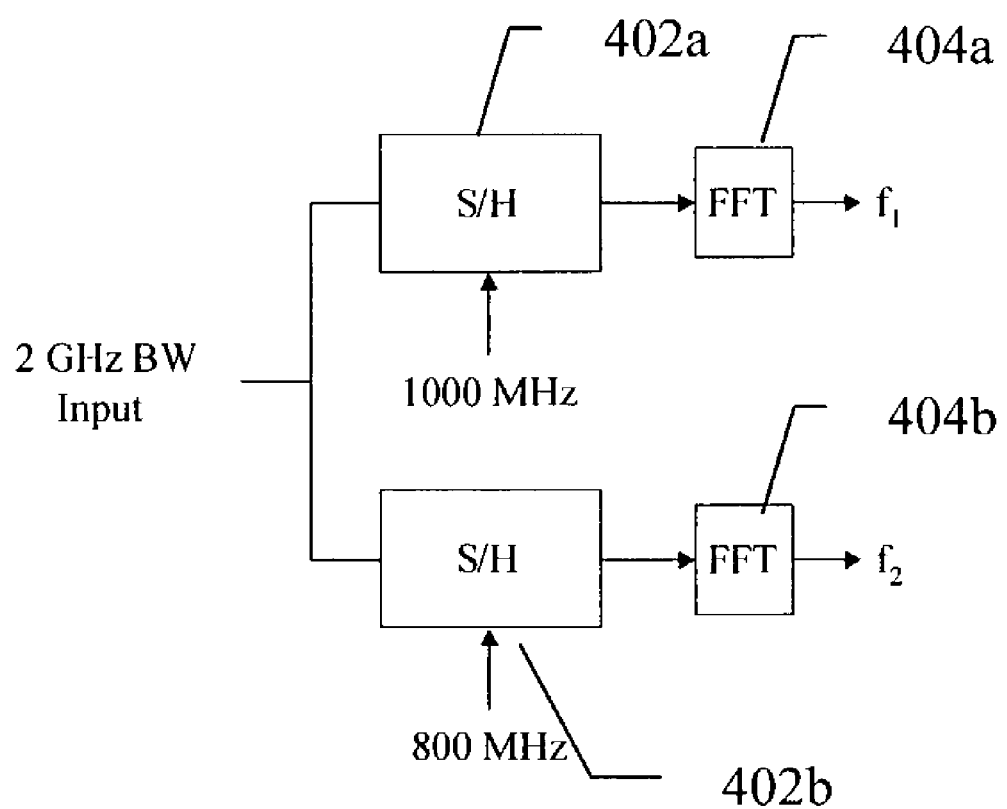
FIG. 4 is a schematic diagram of a system for extending a frequency range of a frequency measuring device using according to an embodiment of the present invention using sampling.

Another embodiment of the present invention for pre-processing the input signal to extend the input range of a frequency measuring device is illustrated in FIG. 4. This embodiment is a sampling embodiment that uses sampling to generate the sub-bands required to implement the present invention rather than RF hardware (mixers, filters, etc.). Any sampling device that can generate a discrete time signal from a continuous time signal can be used. Such sampling devices include sample-and-hold (S/H) amplifiers, track-and-hold devices and analog-to-digital converters (ADCs). The input signal need only be sampled; it does not have to be digitized.

FIG. 4 is a schematic diagram of a system using S/H amplifiers to generate the necessary sub-bands through operation of the sampling process according to an embodiment of the present invention. An input signal is applied to a S/H amplifier 402a and to a S/H amplifier 402b. Each S/H amplifier is clocked by a different sampling rate. For example, S/H 402a is clocked to sample at 1000 MHz (for an effective bandwidth of 500 MHz) and S/H 402 is clocked to sample at 800 MHz (for an effective bandwidth of 400 MHz).

The output of S/H amplifier 402a is input to a frequency measuring device 404a. Again, assuming a single-frequency signal for simplicity, frequency measuring device 404a detects the frequency of the input signal in a 500 MHz bandwidth. The output of S/H amplifier 402b is input to a frequency measuring device 404b. Frequency measuring device 404b detects the frequency of the input signal in a 400 MHz bandwidth. The frequency outputs of frequency measuring devices 404a and 404b are input to a reconstruction algorithm to determine the frequency of the original input signal.

The sampling embodiment of the present invention makes use of aliasing and the folding characteristics of a sampled signal. For a signal samples at a sampling frequency, $f_s$, the frequency content of the signal will be folded into the bandwidth from 0 to $$\frac{f_s}{2}.$$

Odd numbered sub-bands are translated to the bandwidth from 0 to $$\frac{f_s}{2}.$$

Even numbered sub-bands are translated and inverted to the bandwidth from 0 to $\frac{f_s}{2}.$

Figure 5:
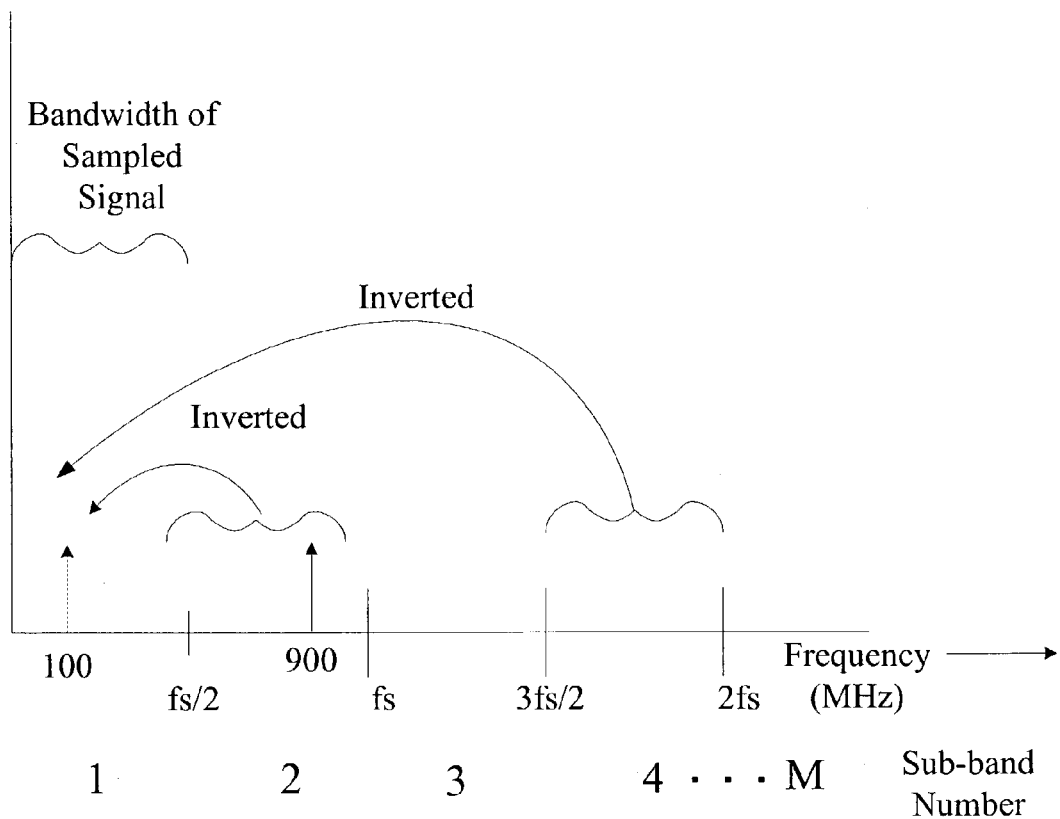
FIG. 5 is a graphical representation of inversion of spectra caused by sampling.

FIG. 5 is a graphical illustration of the translation and spectral inversion caused by sampling according to the sampling embodiment of the present invention As can be seen from the graphical representation in FIG. 5, each of the even numbered sub-bands is translated and inverted. For example, assume $f_s=1000$ MHz. Then the bandwidth of the sampled signal is from 0 to 500 MHz. If the input signal has a single frequency of 900 MHz, the input signal would appear at 100 MHz in the output of a frequency measuring device as shown in FIG. 5 due to aliasing. As can be seen, in the sampling embodiment, the process of sampling performs the translation and summing of the signals inherently without need for RF hardware such as mixers, filters, summers, etc.

The sampling process causes an ambiguity that must be resolved. The ambiguity results because some input frequencies are mapped to the same set of frequencies $\{f_1, f_2\}$. Thus, simply knowing the set of frequencies $\{f_1, f_2\}$ is not sufficient to provide the input signal frequency giving rise to the frequency set $\{f_1, f_2\}$.

Figure 6:
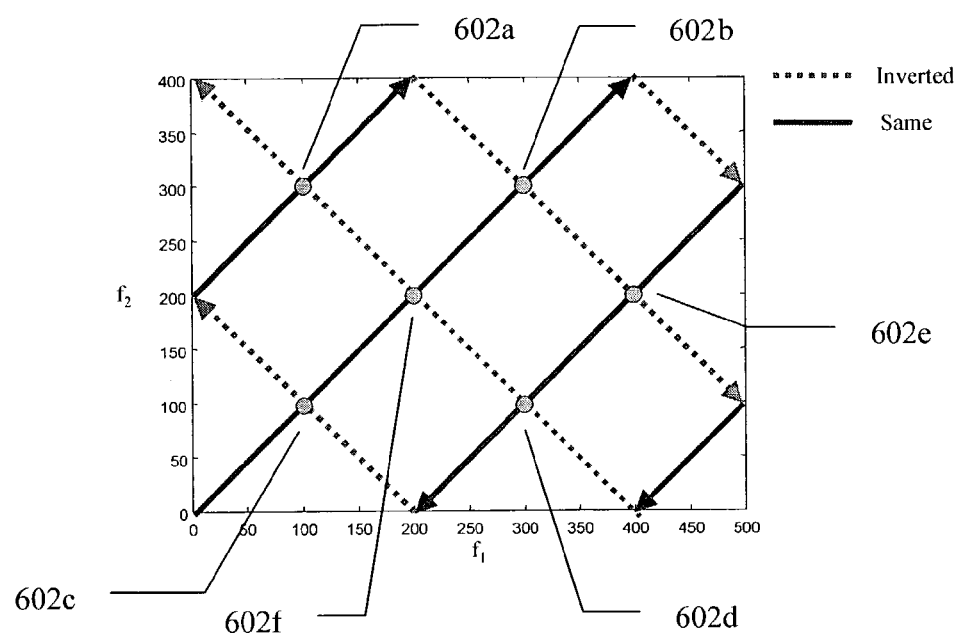
FIG. 6 is a graphical representation of a one-to-one mapping of a set of frequencies to a frequency of an input signal according to an embodiment of the present invention using sampling.

This ambiguity can be seen by the graph in FIG. 6. FIG. 6 is a graphical representation of frequency in a 2 GHz bandwidth as a function of the set of frequencies $\{f_1, f_2\}$ as the frequency is swept from 0 to 2 GHz. The ambiguity arises where the sweeping intersects upon itself, for example at intersection points 602a, 602b, 602c, 602d, 602e and 602f. For example, the frequency set $\{f_1, f_s\}=\{100, 300\}$ can be caused by an input signal frequency of 1.1 GHz or 1.9 GHz.

In the present case, the intersections are due to the inversion of the even-numbered spectra (described above). When the spectrum inverts, the sweeping of the frequencies changes direction. Because, the sweeping for the two frequencies $f_1$ and $f_2$ occur at different rates, the change in direction will cause the intersections. A point of intersection indicates that more than one possible frequencies of the input signal map into the same set of frequencies $\{f_1, f_2\}$, thereby eliminating the desired one-to-one mapping of input frequencies to frequency sets $\{f_1, f_2\}$. Consequently, without more, the ambiguity at the intersection would preclude determination of which of the multiple frequencies corresponding to the intersection point is the correct one.

This ambiguity is can be resolved. An inspection of the graph shown in FIG. 6 reveals that the solid lines are formed where the both $f_1$ and $f_2$ are in an inverted portion of the spectrum (i.e., even numbered spectrum) or both $f_1$ and $f_2$ are not inverted (i.e., in an odd portion of the spectrum). The dashed lines are formed where either one of $f_1$ or $f_2$ is in an inverted portion of the spectrum and the other is not or vice versa. This fact can be used to resolve the ambiguity to determine the input signal frequency.

One way to resolve the ambiguity using this knowledge is to determine not only the frequency seen in a particular channel, but also the sense of the frequency relative to the frequency measured by the other channel. This can be performed by the frequency measuring device so long as the frequency measuring device can provide a sense of the frequency as well as its magnitude. For example, the phase of the frequencies determined in each of the channels can be determined. If the signals are in-phase, they fall on a solid line in the graph of FIG. 6. If the signals are out-of-phase, they fall on a dashed line in the graph of FIG. 6. If the frequency measuring device is an FFT processor, for example, the phase is calculated as well as the amplitude. Signals are out-of-phase if one is the conjugate of the other, and in phase if not to within some measurement error.

If the phases are the same, i.e., the frequencies are in phase, then frequencies have the same sense, and therefore fall on a solid line in the graph of FIG. 6. If they are not the same, the frequencies are out of phase (i.e., inverted with respect to one another), and therefore fall on a dashed line in the graph of FIG. 6. For example, if the channels are in phase at intersection point 602a, the frequency of the input signal would be 1.1 GHz. If the channels are out-of-phase at intersection point 602b, the frequency of the input signal would be 1.9 GHz.

The parameters corresponding to Equation 1 for the sampling embodiment example of the present invention are N=2 using a mix of inverted and non-inverted segments. For the first channel, $M_1=4$, $\Delta_{1j}=-(j-1)*500$ MHz for j=1,3 with non-inverted segments and $\Delta_{1j}=(j-1)*1000$ MHz for j=2,4 with inverted segments over $[L_1, U_1]=[0,500$ MHz$]$. For the second channel, $M_2=5$, $\Delta_{2j}=-(j-1)*400$ MHz for j=1,3,5 with non-inverted segments and $\Delta_{2j}=(j-1)*400$ MHz for j=2,4 with inverted segments over $[L_2, U_2]=[0,400$ MHz$]$. If the same signal is observed at $f_1$ in $\hat{S}_1(f)$ and at $f_2$ in $\hat{S}_2(f)$, then the original frequency of the corresponding signal in $S_1(f)$ and $S_2(f)$ is unambiguously given by f over a range [0, 2 GHz] as shown in Table 2.

The frequency reconstruction rule for this example is provided in Table 2.

TABLE 2

Input frequency reconstruction rule

| f | $f_1 - f_2$ | $f_1 + f_2$ | f |
|---|---|---|---|
| 0-400 MHz | 0 | | $(f_1 + f_2)/2$ |
| 400-500 MHz | | 800 MHz | $(800 + f_1 - f_2)/2$ |
| 500-800 MHz | 200 MHz | | $(1800 - f_1 - f_2)/2$ |
| 800-1000 MHz | | 200 MHz | $(1800 - f_1 + f_2)/2$ |
| 1000-1200 MHz | -200 MHz | | $(1800 + f_1 + f_2)/2$ |
| 1200-1500 MHz | | 600 MHz | $(2600 + f_1 - f_2)/2$ |
| 1500-1600 MHz | 400 MHz | | $(3600 - f_1 + f_2)/2$ |
| 1600-2000 MHz | | 400 MHz | $(3600 + f_1 + f_2)/2$ |

To use the Table 2, the relative sense of the frequencies output by the frequency measuring devices is determined. If the frequencies are in phase, i.e., have the same sense, then the difference of the frequencies is taken. The difference is compared to the values in the $f_1-f_2$ column of table 2. The row with the value closest to the difference is chosen as the row containing the reconstruction rule to use to determine the original input signal frequency. If the frequencies are out-of-phase, i.e., have a different sense, then the sum of the frequencies is taken. The sum is compared to the values in the $f_1+f_2$ column of table 2. The row with the value closest to the sum is chosen as the row containing the reconstruction rule to use to determine the original input signal frequency.

For example, if the set of frequencies $\{f_1, f_s\}$ using the sampling embodiment of the present invention is $\{100, 300\}$, then the input signal frequency can be either 1.1 GHz or 1.9 GHz, as described above. To resolve this ambiguity, the phase of the frequencies is use. If the frequencies $\{f_1, f_s\}$ are in phase, then the difference in frequencies $f_1-f_2$ is calculated. In this case, the difference is $-200$, which corresponds to reconstruction rule $(1800+f_1+f_2)/2$. This yields a reconstructed frequency of 1.1 GHz for the input signal. If the frequencies $\{f_1, f_s\}$ are out-of-phase, then the sum of the frequencies $f_1+f_2$ is calculated. In this case, the difference is 400, which corresponds to reconstruction rule $(3600-f_1+f_2)/2$. This yields a reconstructed frequency of 1.9 GHz for the input signal.

If the input signal is modulated, then the spectrum of the modulated signal is reversed in each even-numbered band. Whether the spectrum is reversed or not relative to another channel being processed can be determined. One way to determine this is cross-correlate the signals from the channels. If the peak value is above a threshold, the signals are determined to be the same relative to one another, otherwise, they are considered to be reversed. As a check, the spectrum of one of the channels can be reversed, and then cross-correlated with the other channel. The cross-correlation peak should be above the threshold if the signal spectra are inverted relative to one another. If the signal spectra are the same relative to one another, the $f_1-f_2$ column is used as described above. If the signal spectra are reversed relative to one another, the $f_1+f_2$ column is used as described above.

The downconverter and sample-hold techniques can be combined serially to translate from higher spectral bands. For example, two sets of downconverters could break up the input spectrum into wider sub-bands (>2 GHz wide) and sum them into two outputs that would then be aliased down to narrower sub-bands by a pair of sampling devices for each output. The frequency reconstruction rules would be applied sequentially. First, the input frequencies to the sampling devices would be recovered using the method illustrated in the second example. These input frequencies are then used as the output frequencies of the downconverter/summer channels, and the original input frequency would be recovered using the method illustrated in the first example.

Sampling can be performed for any band of interest without downconversion, provided the S/H amplifier has a sufficient bandwidth to process the input signal. However, S/H amplifiers typically have limited bandwidth. Consequently, in many cases it is preferable to first downconvert the input signal so that the input signal falls in the bandwidth of the S/H amplifier being used. Preferably, the signal is downconverted so that the lower bound is almost, but not quite, zero, for example 10 KHz. The reason for doing this is to avoid foldover (aliasing) issues that might otherwise result.

Each of the embodiments of the present invention described above uses a plurality of frequency measuring devices, one per channel. In another embodiment, only one frequency measuring device is used. The signals from each of the channels is applied to the frequency measuring device in turn. In yet another embodiment of the present invention, more than one frequency measuring device is used, though less than one per channel. That is, at least one of the frequency measuring devices is used to process the signals from more than channel.

For simplicity, the foregoing embodiments of the present invention were described in terms of two channels, thereby providing mappings using frequency sets having two elements. As will be recognized by equation (1), the present invention can also be implemented in embodiments having more than two channels. That is, the present invention is scalable. In the case where more than two channels are used, N of equation (1) is set equal to the number of channels. Processing then continues as described above, but with multiple channels with reconstruction rules created as appropriate for the multiple channels.

The present invention is also scalable through cascading of processing elements, such as those processing elements described above. This might be done to provide intermediate processing for a particular implementations of the present invention. One reason for doing is to reduce the cost of the processing elements that need to be used. For example, consider the where processing is performed in the 6 GHz-8 GHz range. Using mixers and filters alone can be costly. Costs can be reduced by using a cascade of both mixers and filters and S/H amplifiers.

Figure 7:
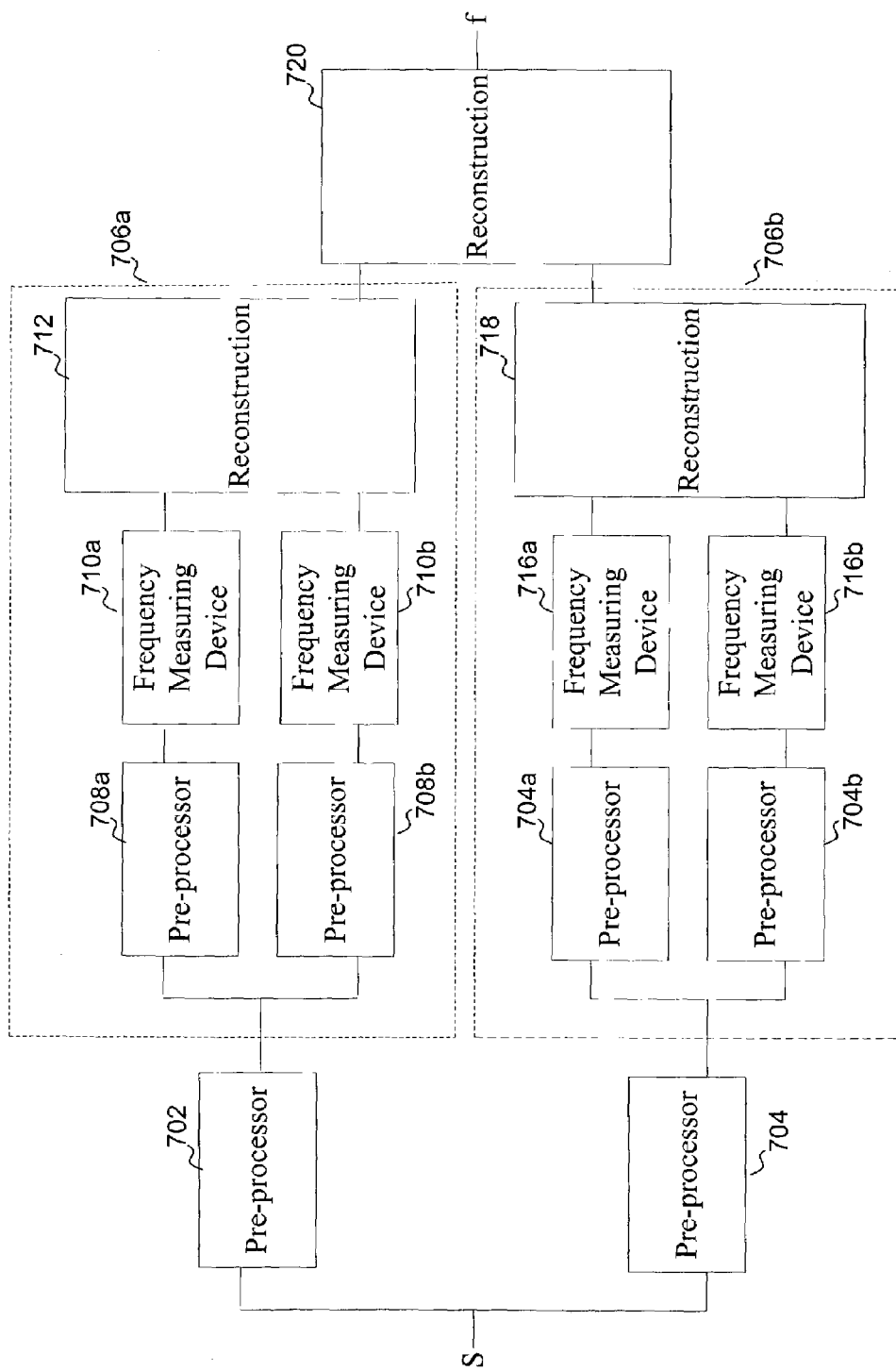
FIG. 7 is a schematic diagram of a system showing cascading of processing elements according to an embodiment of the present invention.

FIG. 7 is an example of a cascade implementation of the frequency extension technique of the present invention. An input signal S(f) is applied to a pre-processor 702 and a pre-processor 704. Pre-processor 702 processes input signal S(f) and generates an output signal $\hat{S}_1(f)$. Similarly, pre-processor 704 processing input signal S(f) to generate an output signal $\hat{S}_2(f)$. For example, pre-processors 702 and 704 can be used to downconvert input signal S(f) to a frequency band that can be processed by frequency measuring devices 710a, 710b, 716a and 716b. This application was alluded to earlier when describing serially applying the downconverter and sampling embodiments of the present invention.

$\hat{S}_1(f)$ is processed by a subsystem 706a. $\hat{S}_2(f)$ is processed by a subsystems 706b. Subsystems 706a and 706b provide the cascading of the frequency extension processing of the present invention. In the present example, subsystems 706a and 706b are similar to the sampling embodiment described above with respect to FIG. 4. Consequently, pre-processors 708a, 708b, 714a and 714b are preferably S/H amplifiers. Frequency measuring devices 710a, 710b, 716a and 716b are preferably FFT processors. Reconstruction elements 712 and 718 preferably use a table similar to table 2 to provide the reconstruction rules to generate the input frequencies associated with $\hat{S}_1(f)$ and $\hat{S}_2(f)$.

These input frequencies are then input to a reconstruction element 720.

Reconstruction element 720 operates according to a reconstruction rule table similar to table 1. Reconstruction element 720 uses the frequencies corresponding to $\hat{S}_1(f)$ and $\hat{S}_2(f)$ to determine the frequency associated with the input signal S(f).

Another embodiment of the present invention uses different inputs for each channel. Ordinarily $S_i(f)=S(f)$ for i=1, ..., N. Some applications, however, derive additional information by using related but unequal input signals $S_i(f)$. One such application is array processing, wherein each input signal is obtained from a different antenna element in an antenna array. The signal of interest is present to some degree at each element, but the relative phases and amplitudes can be exploited to perform radio direction finding and beam forming. This information is preserved by the invention and can thus be recovered after the downconversion or aliasing.

Figure 8:
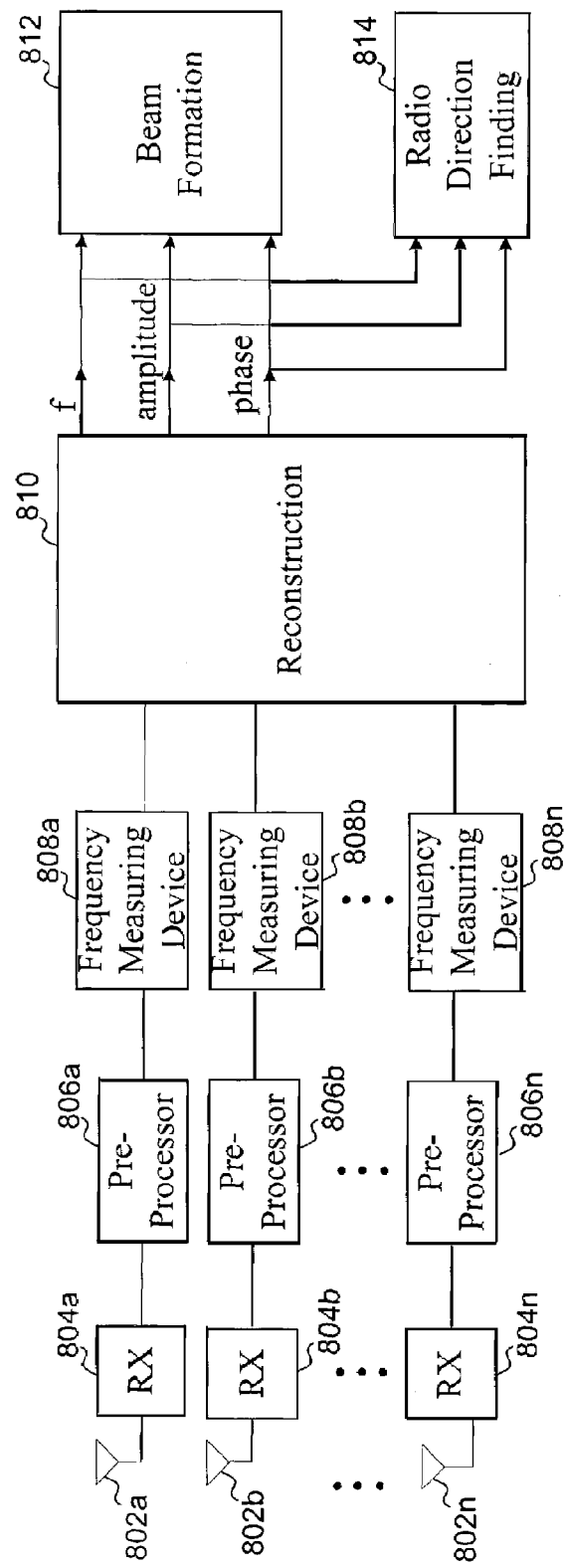
FIG. 8 is a schematic diagram of a system according to the present invention for processing a different input signal.

FIG. 8 illustrates schematically a system for processing different input signals in two or more channels according to an embodiment of the present invention. N signals are collected by N antenna elements 802a, 802b, ... 802n, wherein N is any positive integer. The signals collected by the N collectors are input to N receivers 804a, 804b, ... 804n. The received signals are input to N pre-processors 806a, 806b, ... 806n. The pre-processors can be RF hardware (e.g., mixers and filters) or S/H amplifiers. The outputs of the N pre-processors are input to N frequency measuring devices 808a, 808b, ... 808n. The frequency measurement devices can be FFT devices for example. The outputs of the N frequency measuring devices are input to a reconstruction element 810.

In one embodiment of the present invention, reconstruction element 810 passes amplitude and phase information associated with the determined frequency (f) calculated by frequency measuring devices 808a, 808b. . . 808n. In another embodiment of the present invention, reconstruction element 810 passes the entire amplitude and phase information calculated by frequency measuring devices 808a, 808b, ... 808n. In another embodiment of the present invention, reconstruction element 810 passes a portion of the amplitude and phase information calculated by frequency measuring devices 808a, 808b, ... 808n. For example, the portion can be a portion centered on the frequency determined by reconstruction element 810 for each channel.

Figure 9:
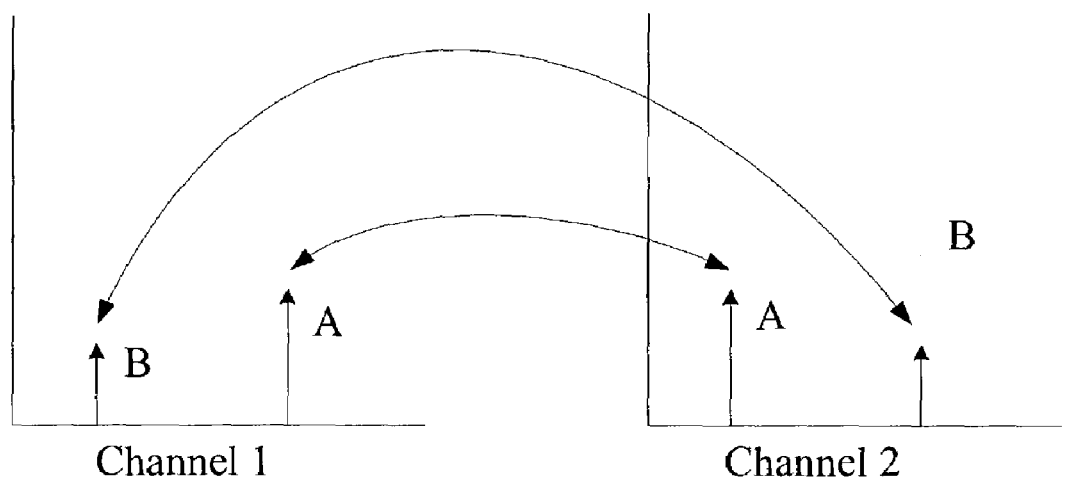
FIG. 9 is a graphical illustration of using amplitude to associate signals in different channels according to an embodiment of the present invention.

This relative amplitude and phase information between the channels can be used as input information to other processes. Such processes include a radio direction finding process 812 and a beam forming process 814 that can be used in applications such as interference cancellation.

Where the input spectra contain more than one signal, the signals detected in each of the channels must be associated with one another. This association can be performed by reconstruction element 810. For example, as shown in FIG. 9, two signals A and B are present in each of two channels, channel 1 and channel 2. The signal-of-interest must be associated in each channel. For example, assume that signal A is the signal of interest. The signal A in channel 1 must be associated with the signal A in channel 2. One way to do this is to associate relative amplitudes output by reconstruction element 810. That is, because the amplitude of signal A is large in channel 1, it is likely to be large in channel 2.

Another means of associating signals is to use the reconstruction rule. For example, using the parameters of sampling example (aliasing), if a signal is detected in the first channel with $f_1$=350 MHz, then from Table 2 (or FIG. 6) the only possible values of $f_2$ for the same signal are 50, 150, 250, and 350 MHz. Thus, if signal A is at 350 MHz in channel 1, the signal that appears at 50, 150, 250, or 350 MHz of channel 2 is chosen, whichever exists.

Another way to view this is to determine which of the signals in channel 2 provides the closest frequency sum or difference appearing in table 2. For example, if the difference between signal A in channel 1 and one of the signals in channel 2 is 100 MHz and the difference between signal A and the other of the signals in channel 2 is 205 MHz, the signal providing the difference of 205 MHz is chosen. This is because the difference of 205 MHz is close to 200 MHz, which is a valid value of signal A in channel 2 given the frequency of signal A in channel 1 was 350 MHz.

Figure 10:
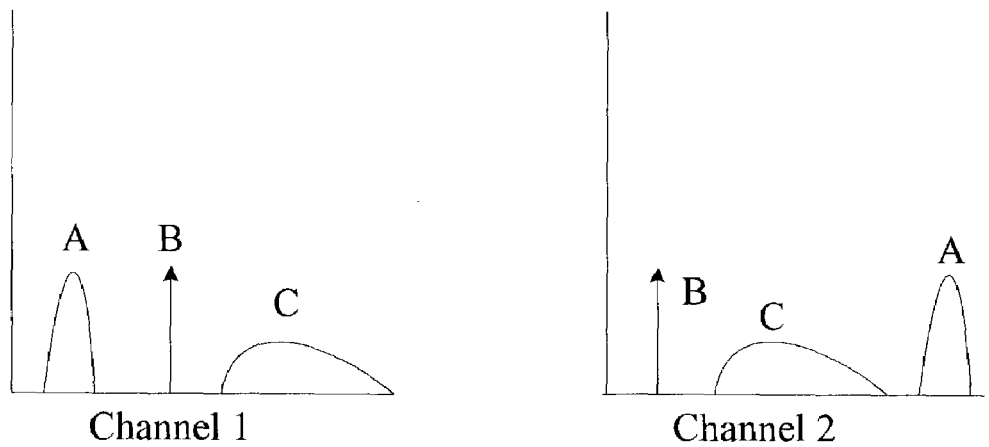
FIG. 10 is a graphical illustration of using spectral shape to associate signals in different channels according to an embodiment of the present invention.

Other signal characteristics such as time of onset, power level, and bandwidth can also be used to associate multiple signals detected in the output channels. For example, as shown in FIG. 10, signals A, B and C have different bandwidths. Signal A is a narrowband signal. Signals B and C are modulated signals. Signal B's bandwidth is narrower than signal C's. These relative bandwidths can be use to associate the signals appearing in channels 1 and 2. In addition, cross-spectral analysis can be used to determine if signals in different channels are related as well as angle of arrival techniques.

Figure 11:
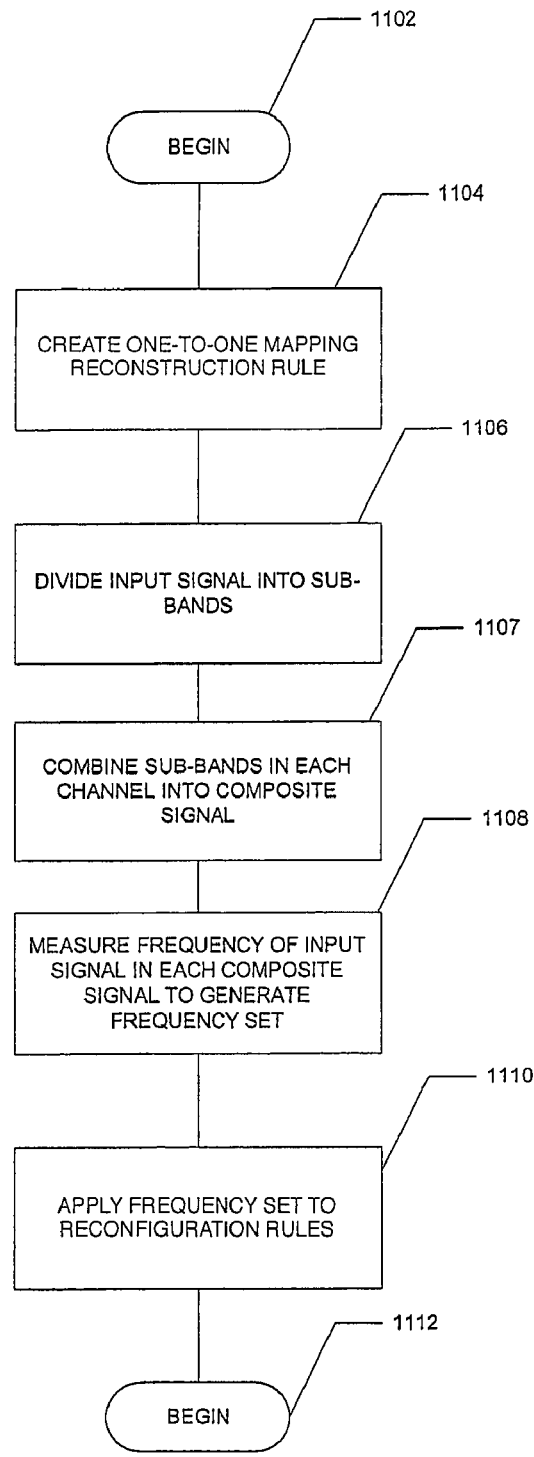
FIG. 11 is a flow chart for a method for extending a frequency range of a frequency measuring device according to an embodiment of the present invention.

FIG. 11 is a flow chart for a method for extending a range of a frequency measuring device according to an embodiment of the present invention. The method can be carried out by any combination of hardware and software. The method begins in step 1102 and immediately continues in step 1104 with the step of creating a one-to-one mapping as a reconstruction rule. Exemplary reconstruction rules have been described above with respect to table 1 and table 2. In step 1106, the method divides an input signal into sub-bands in a plurality of channels. Step 1106 corresponds to the pre-processing elements described above. In step 1107, the sub-bands in each channel are combined to form a composite signal in each channel. As described above, the combining can be performed by summing the sub-bands in each channel. In step 1108, the method measures the frequency of the input signal in each sub-band to generate a frequency set. In step 1110, the frequency set obtained from the frequency measuring device is applied to the reconstruction rules to determine a frequency associated with the input signal. The method ends in step 1112.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A system for extending the range of a frequency measuring device having a limited range, comprising:
    a plurality of channels to process an input signal;
    a pre-processing element for each channel to divide the input signal into a plurality of sub-bands, each channel having a different set of sub-bands;
    a combining element for each channel to combine the plurality of sub-bands into a composite signal having a bandwidth within the limited range of the frequency measuring device, wherein the frequency measuring device measures a frequency for each composite signal to form a frequency set; and
    a reconstruction element to receive the frequency set and use the frequency set to determine a frequency associated with the original signal.

2. The system recited in claim 1, further comprising a frequency measuring device for each channel.

3. The system recited in claim 1 wherein there are two channels, further comprising a table comprising a column having relative frequency different values corresponding to particular bands of a spectrum of the input signal and a corresponding reconstruction rule, wherein the reconstruction element determines a relative difference between the two frequencies of the frequency set, finds the closest match in the column, and uses the corresponding reconstruction rule to determine the frequency associated with the original signal.

4. A method for extending a range of a frequency measuring device having a limited range, comprising the steps of:
    (a) creating a one-to-one mapping of a set of frequencies to a frequency of an input signal in an input signal range;
    (b) receiving an input signal;
    (c) applying the signal to a plurality of channels;
    (d) dividing the input signal into a plurality of sub-bands in each channel, wherein the sub-bands in each channel are different from the sub-bands in every other channel;
    (e) combining the plurality of sub-bands into a composite signal having a bandwidth within the limited range of the frequency measuring device;
    (f) measuring a frequency for each composite signal to form a frequency set; and
    (g) reconstructing a frequency associated with the input signal using the frequency set.

\* \* \* \* \*